US012352306B2

(12) United States Patent
Sohn et al.

(10) Patent No.: US 12,352,306 B2
(45) Date of Patent: Jul. 8, 2025

(54) WORKPIECE SUPPORT FOR A THERMAL PROCESSING SYSTEM

(71) Applicants: Mattson Technology, Inc., Fremont, CA (US); Beijing E-Town Semiconductor Technology Co., Ltd., Beijing (CN)

(72) Inventors: Manuel Sohn, Ulm (DE); Rolf Bremensdorfer, Bibertal (DE); Dieter Hezler, Lonsee-Halzhausen (DE)

(73) Assignees: Beijing E-Town Semiconductor Technology Co., Ltd., Beijing (CN); Mattson Technology, Inc., Fremont, CA (US)

(*) Notice: Subject to any disclaimer, the term of this patent is extended or adjusted under 35 U.S.C. 154(b) by 767 days.

(21) Appl. No.: 17/550,148

(22) Filed: Dec. 14, 2021

(65) Prior Publication Data

US 2022/0205478 A1 Jun. 30, 2022

Related U.S. Application Data

(60) Provisional application No. 63/175,204, filed on Apr. 15, 2021, provisional application No. 63/130,982, filed on Dec. 28, 2020.

(51) Int. Cl.
*F16C 17/03* (2006.01)
*F27B 17/00* (2006.01)
(Continued)

(52) U.S. Cl.
CPC .......... *F16C 17/03* (2013.01); *F27B 17/0025* (2013.01); *F27D 5/0037* (2013.01); *H01L 21/67098* (2013.01)

(58) Field of Classification Search
CPC ..... F16C 17/03; B65G 47/80; B65G 2812/14; F27B 17/0025; F27D 5/0037; H01L 21/67098
(Continued)

(56) References Cited

U.S. PATENT DOCUMENTS 6,005,226 A 12/1999 Aschner et al.
6,449,428 B2 9/2002 Aschner et al.
(Continued)

FOREIGN PATENT DOCUMENTS

KR 101347397 1/2014
KR 101875360 7/2018

OTHER PUBLICATIONS

International Search Report and Written Opinion for Application No. PCT/US2021/063495, mailed Apr. 21, 2022, 9 pages.

*Primary Examiner* — Jimmy Chou
*Assistant Examiner* — William C. Gibson
(74) *Attorney, Agent, or Firm* — Dority & Manning, P.A.

(57) ABSTRACT

A workpiece support for a thermal processing system is provided. The workpiece support includes a rotor configured to support a workpiece. The workpiece support further includes a gas supply. The gas supply can include a plurality of bearing pads. Each of the bearing pads can be positioned closer to a periphery of the rotor than a center of the rotor. Each of the bearing define one or more passages configured to direct gas onto the rotor to control a position of the rotor along a first axis and a second axis that is substantially perpendicular to the first axis. Furthermore, one or more of the bearing pads define at least one additional passage configured to direct gas onto the rotor to control rotation of the rotor about the first axis.

15 Claims, 10 Drawing Sheets

(51) Int. Cl.
*F27D 5/00* (2006.01)
*H01L 21/67* (2006.01)

(58) Field of Classification Search
USPC .......................................................... 392/418
See application file for complete search history.

(56) References Cited

U.S. PATENT DOCUMENTS

| | | | |
|---|---|---|---|
| 7,112,763 | B2 | 9/2006 | Hunter et al. |
| 7,616,872 | B2 | 11/2009 | Camm et al. |
| 8,296,091 | B2 | 10/2012 | Timans |
| 8,920,162 | B1 | 12/2014 | Nordin et al. |
| 9,627,244 | B2 | 4/2017 | Camm et al. |
| 2013/0188895 | A1* | 7/2013 | Devitt ................. F16C 32/0685 |
| | | | 384/121 |
| 2014/0376896 | A1* | 12/2014 | Karazim ........... H01L 21/68785 |
| | | | 392/416 |
| 2016/0197001 | A1 | 7/2016 | Samir |
| 2019/0221455 | A1 | 7/2019 | Seo |
| 2019/0394836 | A1 | 12/2019 | Hwang et al. |

* cited by examiner

WORKPIECE SUPPORT FOR A THERMAL PROCESSING SYSTEM

PRIORITY CLAIM

The present application claims the benefit of priority of U.S. Provisional Application Ser. No. 63/130,982, titled "Centerless Rotational Support for Thermal Processing," filed on Dec. 28, 2020, which is incorporated herein by reference. The present application claims the benefit of priority of U.S. Provisional Application Ser. No. 63/175,204, titled "Centerless Rotational Support for Thermal Processing," filed on Apr. 15, 2021, which is incorporated herein by reference.

FIELD

The present disclosure relates generally to thermal processing systems, and more to particularly a workpiece support for thermal processing systems.

BACKGROUND

Thermal processing systems include a processing chamber in which one or more workpieces, such as semiconductor workpieces (e.g., semiconductor wafers), can be heated. Such systems can include a support for one or more workpieces. Additionally, such systems can include an energy source (e.g., heat lamps, lasers, etc.) for heating the one or more workpieces. During heat treatment, the one or more workpieces can be heated according to a processing regime.

SUMMARY

Aspects and advantages of embodiments of the present disclosure will be set forth in part in the following description, or may be learned from the description, or may be learned through practice of the embodiments.

In one aspect, a workpiece support for a thermal processing system is provided. The workpiece support includes a rotor configured to support a workpiece. The workpiece support further includes a gas supply. The gas supply includes a plurality of bearing pads. Each of the bearing pads is positioned closer to a periphery of the rotor than a center of the rotor. Each of the bearing pads define one or more passages configured to direct gas flowing therethrough onto the rotor to control a position of the rotor along a first axis and a second axis that is substantially perpendicular to the first axis. Furthermore, one or more of the bearing pads define at least one additional passage configured to direct gas flowing therethrough onto the rotor to control rotation of the rotor about the first axis.

In another aspect, a thermal processing system is provided. The thermal processing system includes a processing chamber. The thermal processing system further includes a workpiece support. The workpiece support includes a rotor disposed within the processing chamber. The rotor is configured to support a workpiece. The workpiece support further includes a gas supply. The gas supply includes a plurality of bearing pads disposed within the processing chamber. Each of the bearing pads is positioned closer to a periphery of the rotor than a center of the rotor. Each of the bearing pads define one or more passages configured to direct gas flowing therethrough onto the rotor to control a position of the rotor along a first axis and a second axis that is substantially perpendicular to the first axis. Furthermore, one or more of the bearing pads define at least one additional passage configured to direct gas flowing therethrough onto the rotor to control rotation of the rotor about the first axis.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
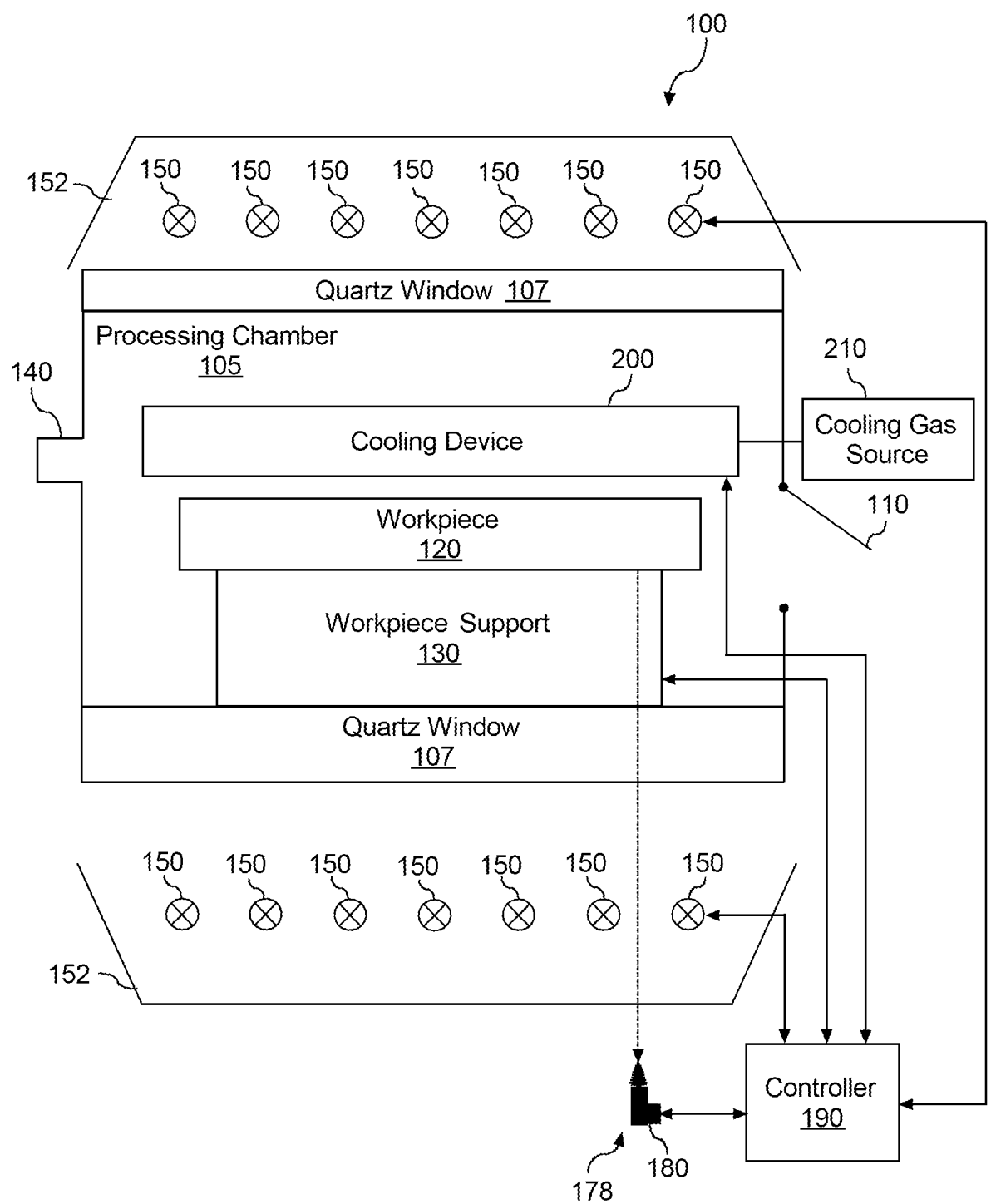
FIG. 1 depicts a thermal processing system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to thermal processing systems, such as rapid thermal processing (RTP) systems, for workpieces (e.g., semiconductor wafers). Thermal processing systems can include a processing chamber in which a workpiece can be subjected to a thermal treatment process (e.g., spike anneal process). Thermal processing systems can further include a workpiece support configured to support the workpiece being processed. The workpiece support can include a rotor configured to support the workpiece. The rotor can be further configured to rotate the workpiece while undergoing the thermal treatment process. In this manner, asymmetric heating and/or cooling of the workpiece can be reduced.

The workpiece support can further include a plurality of bearing pads. The bearing pads can define a passage configured to direct gas onto the rotor to lift the rotor off of the bearing pads. In this manner, the rotor can be suspended above the bearing pads via a plurality of gas cushions (that is, the gas exiting the passage defined in each of the bearing pads). Furthermore, one or more of the bearing pads can define one or more additional passages configured to direct the gas towards to the rotor control rotation of the rotor. For instance, the one or more additional passages can be configured to direct the gas towards the rotor as needed to speed up (that is, accelerate) rotation of the rotor or slow down (that is, decelerate) rotation of the rotor.

The workpiece support can further include a shaft and ball bearing to provide a centering force for the rotor. However, mechanical friction between the shaft and the ball bearing can generate particles that can contaminate the workpiece. Furthermore, the shaft can cast a shadow on the workpiece. The shadow can lead to uneven heating of the workpiece during the thermal treatment process.

Example aspects of the present disclosure are directed to a workpiece support for thermal processing systems. The workpiece support can include the rotor and the plurality of bearing pads. Each of the plurality of bearing pads can be positioned closer to a periphery of the rotor than a center of the rotor. Furthermore, one or more passages can be defined in each of the bearing pads. The one or more passages can be configured to direct gas flowing therethrough onto the rotor to control a position of the rotor along a first axis (e.g., vertical) and a second axis (e.g., transverse, radial) that is substantially perpendicular (e.g., less than a 15 degree, less than a 10 degree, less than a 5 degree, less than a 1 degree, etc. difference from 90 degrees) to the first axis. In this manner, the workpiece support according to example embodiments of the present disclosure can provide the centering force for the rotor without the ball bearing and shaft discussed above.

In some implementations, the rotor can define an aperture. Furthermore, the rotor can be configured to support the workpiece such that the workpiece is suspended over the aperture defined by the rotor. In this manner, one or more heating sources configured to heat the workpiece can have an unobstructed view of the workpiece.

In some implementations, the one or more passages defined in each of the bearing pads can include a first passage extending along the first axis. In this manner, the first passage can be configured to direct the gas flowing therethrough onto the rotor to control a position of the rotor along the first axis. For instance, the rotor can be spaced apart from the plurality of bearing pads along the first axis via a plurality of gas cushions (that is, the gas exiting the first passage defined in each of the bearing pads). In some implementations, a gap defined between the rotor and the plurality of bearing pads along the first axis can range from about 10 micrometers to about 50 micrometers.

In some implementations, the one or more passages defined in each of the bearing pads can further include a second passage extending along the second axis. In this manner, the second passage can be configured to direct the gas flowing therethrough onto the rotor to control a position of the rotor along the second axis. For instance, the rotor can be spaced apart from plurality of bearing pads along the second axis via a plurality of gas cushions (that is, the gas exiting the second passage defined in each of the bearing pads). In some implementations, a gap defined between the rotor and the plurality of bearing pads along the second axis can range from about 10 micrometers to about 50 micrometers.

In some implementations, at least one of the first passage or the second passage can be tapered. For instance, the first passage can taper along the first axis such that the first passage does not have a constant diameter. More specifically, a diameter of the first passage can narrow to resemble a nozzle and thereby increase a pressure of the gas exiting the first passage. Alternatively, or additionally, the second passage can taper along the second axis such that the second passage does not have a constant diameter. More specifically, a diameter of the second passage can narrow to resemble a nozzle and thereby increase a pressure of the gas exiting the second passage.

In addition to the one or more passages configured to direct gas flowing therethrough onto the rotor to control a position of the rotor along the first axis and the second axis, one or more of the bearing pads can define at least one additional passage configured to direct gas flowing therethrough onto the rotor to control rotation of the rotor about the first axis. For instance, the at least one additional passage can be configured to direct the gas flowing therethrough onto the rotor to speed up (that is, accelerate) rotation of the rotor about the first axis. Alternatively, the at least one additional passage can be configured to direct the gas flowing therethrough onto the rotor to slow down (that is, decelerate) rotation of the rotor about the first axis.

In some implementations, the at least one additional passage can include a third passage and a fourth passage. The third passage can be configured to direct the gas flowing therethrough onto the rotor to speed up (that is, accelerate) rotation of the rotor about the first axis. Conversely, the fourth passage can be configured to direct the gas flowing therethrough onto the rotor to slow down (that is, decelerate) rotation of the rotor about the first axis.

The workpiece support assembly according to example embodiments of the present disclosure can provide numerous technical effects and benefits. For instance, the at least one passage disposed in each of the bearing pads and configured to direct gas flowing therethrough onto the rotor control a position of the rotor along the first axis and the second axis can eliminate the need for a ball bearing and shaft to provide the centering force for the rotor. In this manner, non-uniform heating of the workpiece due, in part, to the shaft casting a shadow on the workpiece are eliminated. Furthermore, particles generated due, in part, to friction between the shaft and the ball bearing that can contaminate the workpiece are eliminated.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, use of the term "about" in conjunction with a numerical value is intended to refer to a range of values within ten percent (10%) of the stated numerical value.

Referring now to the figures, FIG. 1 depicts a thermal processing system 100 according to example embodiments of the present disclosure. As shown, the thermal processing system 100 can include a processing chamber 105. In some implementations, the processing chamber 105 can be defined, at least in part, by quartz windows 107 of the thermal processing system 100. For instance, one of the quartz windows 107 may at least partially define a ceiling of the processing chamber 105 and another of the quartz windows 107 may at least partially define a floor or bottom surface of the processing chamber 105. In some implementations, the quartz windows 107 can be doped with hydroxide OH. It should be appreciated that the one or more surfaces defining the processing chamber 105 can be formed from any suitable material. For instance, in some implementations, the one or more surfaces defining the processing chamber 105 can be formed from quartz.

As shown, the thermal processing system 100 can include a door 110 movable between an open position (e.g., as shown in FIG. 1) and a closed position (not shown) to permit selective access to the processing chamber 105. For instance, the door 110 can be moved to the open position to allow a workpiece 120 to be positioned within the processing chamber 105. In some implementations, the workpiece 120 can be supported, at least in part, by a workpiece support 130 positioned within the processing chamber 105. In this manner, heat associated with emitting light onto the lower quartz window 170 can be at least partially transferred to the workpiece 120 via the workpiece support 130. Furthermore, the door 110 can be moved to the closed position once the workpiece 120 is disposed on the workpiece support 130. In some implementations, the processing chamber 105 can be sealed off from an external environment when the door 110 is in the closed position.

In some implementations, the one or more surfaces defining the processing chamber 105 can define a gas inlet port 140. In this manner, a process gas provided from a gas source can flow into the processing chamber 105 via the gas inlet port 140. In some implementations, the process gas can include an inert gas that does not react with the workpiece 120. Alternatively, the process gas can include a reactive gas that reacts with workpiece 120 to deposit a layer of material on the surface of the workpiece 120. For instance, in some implementations, the process gas can include ammonium $NH_3$ gas. It should be appreciated, however, that the process gas can include any suitable reactive gas. For instance, in alternative implementations, the reactive gas can include $H_2$ gas.

The thermal processing system 100 can include one or more heat sources 150 configured to heat the workpiece 120. The heat sources 150 can be disposed outside of the processing chamber 105. For instance, the heat sources 150 may be positioned above the processing chamber 105, below the processing chamber 105, or both above and below the processing chamber 105. The one or more heat sources 150 can be configured to emit light towards the workpiece 120 during a thermal treatment process, such as a rapid thermal treatment, or a spike anneal process. More particularly, the heat sources 150 positioned above the processing chamber 105 may be configured to emit light towards an upper surface or side of the workpiece 120 and the heat sources 150 positioned below the processing chamber 105 may be configured to emit light towards a lower surface or side of the workpiece 120 during a thermal treatment process. The light emitted from the one or more heat sources 150 can raise a temperature of the workpiece 120. In some implementations, the one or more heat sources 150 can increase the temperature of the workpiece 120 by greater than about 500° C. within a predetermined amount of time (e.g., less than 2 seconds).

It should be appreciated that the one or more heat sources 150 can include any suitable type of heat source configured to emit light. For instance, in some implementations, the one or more heat sources 150 can include one or more heat lamps (e.g., linear lamps). In alternative implementations, the one or more heat sources 150 can include one or more lasers configured to emit a laser beam onto the workpiece 120. It should further be appreciated that the heat sources 150 positioned above the processing chamber 105 may be controlled separately from the heat sources 150 positioned below the processing chamber 105 or may be controlled together for performing a thermal treatment process.

In some implementations, the thermal processing system 100 can include one or more reflectors 152 positioned such that the light emitted from the one or more heat sources 150 is directed to or towards the processing chamber 105. More specifically, the reflectors 152 can direct the light emitted from the one or more heat sources 150 to or towards the respective quartz window 107 such that the light can pass through the respective quartz window 107 and into the processing chamber 105. It should be appreciated that at least a portion of the light entering the processing chamber 105 via the quartz window(s) 107 can be emitted onto the workpiece 120. In this manner, the light emitted from the one or more heat sources 150 can, as discussed above, raise the temperature of the workpiece 120 during a thermal treatment process, such as a rapid thermal treatment process (e.g., spike anneal treatment).

In one implementations, the thermal processing system 100 can include a temperature measurement system 178 configured to generate and communicate data indicative of a temperature of the workpiece 120. The temperature measurement system 178 may include one or more temperature sensors 180. The temperature sensor(s) 180 may comprise pyrometer(s), thermocouple(s), thermistor(s), or any other suitable temperature sensor or combination of temperature sensors. The temperature sensor(s) 180 may be positioned within the processing chamber 105 or may be positioned exterior to the processing chamber 105, depending on the type of sensor. For example, if the temperature sensor(s) 180 is a pyrometer, the pyrometer does not need to contact the workpiece 120, and thus, may be positioned exterior to the processing chamber 105. However, if the temperature sensor (s) 180 is a thermocouple, the thermocouple must be in contact with the workpiece 120, and thus, may be positioned interior to the processing chamber 105. Further, the temperature sensor(s) 180 may be communicatively coupled to a controller 190, by a wired connection, a wireless connection, or both, such that the data generated by the temperature sensor(s) 180 indicative of the temperature of the workpiece 120 may be provided to the controller 190.

In some implementations, the thermal processing system 100 can include a cooling system 200 configured to flow cooling gas from a gas source 214 across the workpiece 120 during a thermal process. The controller 190 can control an operation of the heat source(s) 150 and the cooling system 200 (e.g., change a rate of supply of cooling gas across the workpiece 120) during a thermal process to reduce a peak width associated with a thermal treatment process. For instance, the controller 190 can control the operation of the cooling system 200 such that the thermal treatment process has a t50 peak width of about 1.8 seconds or less, such as about 1.5 seconds or less. Additionally, the controller 190 can control an operation of the workpiece support 130 to rotate the workpiece 120. For instance, the controller 190 can control the operation of the workpiece support 130 to rotate the workpiece 120 during a thermal treatment process, such as at least during the operation of the cooling system 200.

In some implementations, the controller 190 (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on or turning off the heat source(s) 150, controlling an operation of the cooling system 200 during the thermal process, or other suitable operation.

Figure 2:
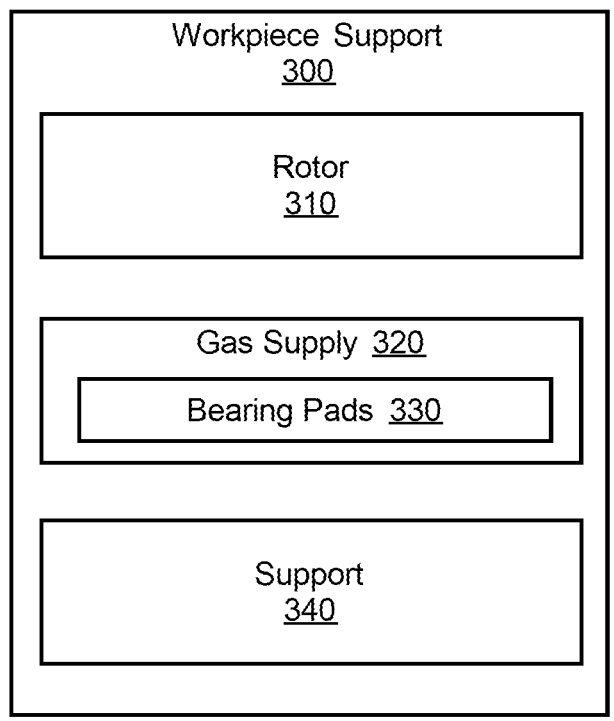
FIG. 2 depicts a block diagram of components of a workpiece support according to example embodiments of the present disclosure.
Figure 3:
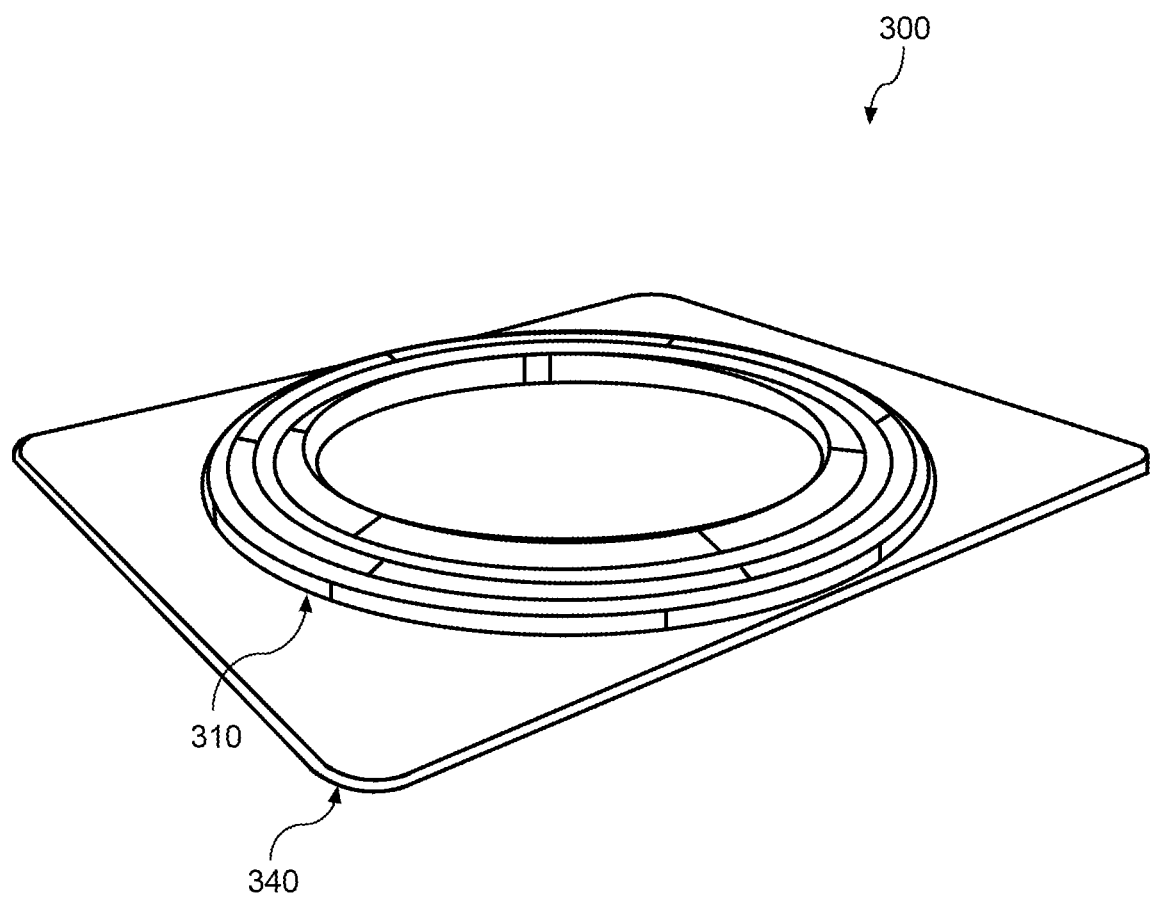
FIG. 3 depicts a perspective view of a workpiece support according to example embodiments of the present disclosure.

Referring now to FIGS. 2 and 3, components of a workpiece support 300 are provided according to example embodiments of the present disclosure. As shown, the workpiece support 300 can include a rotor 310. The rotor 310 can be configured to support a workpiece, such as the workpiece 120 discussed above with reference to FIG. 1. The workpiece support 300 can further include a gas supply 320. The gas supply 320 can include a plurality of bearing pads 330. Each of the plurality of bearing pads 330 can define at least one passage configured to direct gas flowing therethrough onto the rotor 310 to control a position of the rotor 310 along a first axis (e.g., vertical) and a second axis (e.g., radial or transverse) that is substantially perpendicular to the first axis. Furthermore, one or more of the bearing pads 330 can define at least one additional passage configured to direct gas flowing therethrough onto the rotor 310 to control rotation of the rotor 310 about the first axis.

In some implementations, the workpiece support 300 can include a support 340 on which the plurality of bearing pads 330 of the gas supply 320 can be positioned. For instance, in some implementations, the support 340 can include one of the quartz windows 107 discussed above with reference to FIG. 1. In alternative implementations, the support 340 can be separate from the quartz windows 107 and positioned within the processing chamber 105 (FIG. 1). In such implementations, the support 340 can include a quartz plate.

Figure 4:
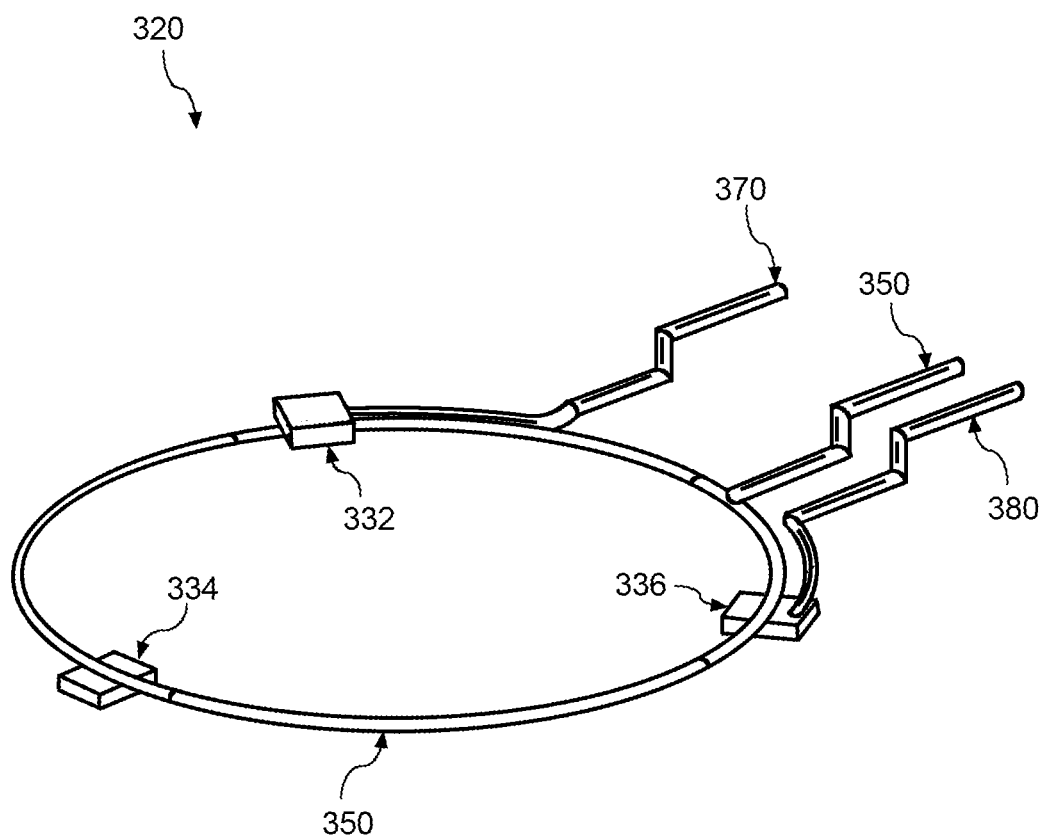
FIG. 4 depicts a gas supply of a workpiece support according to example embodiments of the present disclosure.
Figure 5:
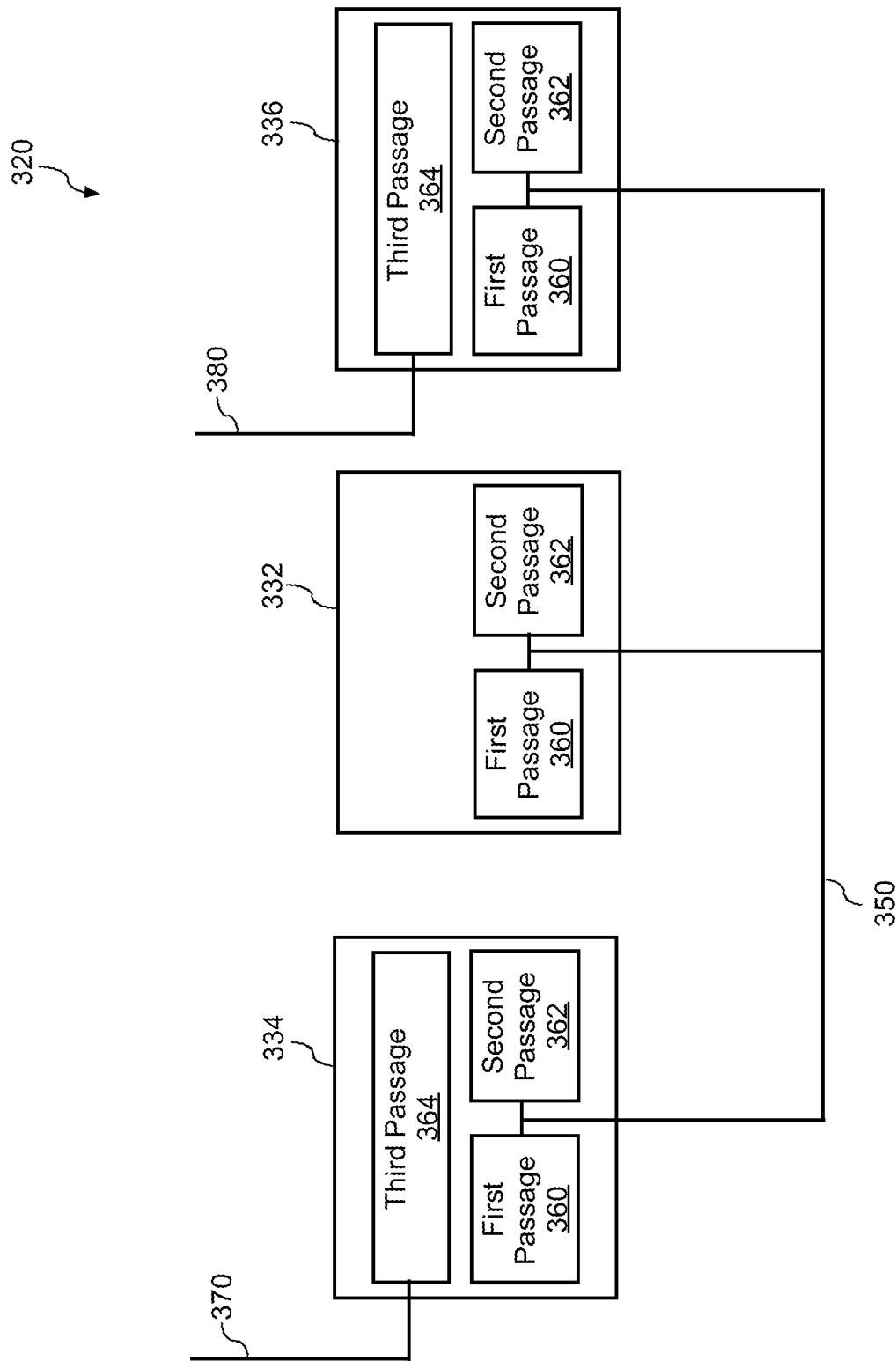
FIG. 5 depicts a gas supply of a workpiece support according to an example embodiment of the present disclosure.

Referring now to FIGS. 4 and 5, a configuration of the gas supply 320 is provided according to example embodiments of the present disclosure. As shown, the gas supply 320 can include a first bearing pad 332, a second bearing pad 334, and a third bearing pad 336. In alternative implementations, the gas supply 320 can include more or fewer bearing pads. Details of the first bearing pad 332, second bearing pad 334, and third bearing pad 336 will now be discussed in more detail.

In some implementations, the gas supply 320 can include a first conduit 350 fluidly coupled to each of the first bearing pad 332, the second bearing pad 334, and the third bearing pad 336. In this manner, gas can be provided to each of the bearing pads (e.g., first bearing pad 332, second bearing pad 334, third bearing pad 336) via the first conduit 350. As shown, the first bearing pad 332, the second bearing pad 334 and the third bearing pad 336 can be positioned at different locations along the first conduit 350. For instance, the first conduit 350 and the bearing pads (e.g., first bearing pad 332, second bearing pad 334 and third bearing pad 336) can form a closed circle to improve mechanical stability and stiffness of the gas supply 320.

In some implementations, the first bearing pad 332, the second bearing pad 334 and the third bearing pad 326 can each define at least one passage that is fluidly coupled to the first conduit 350. Furthermore, the at least one passage can be configured to direct gas flowing therethrough onto the rotor 310 (FIG. 3) to control a position of the rotor 310 along the first axis and the second axis. In this manner, the position of the rotor 310 along the first axis and the second axis can be controlled via a plurality of gas cushions (that is, gas exiting the at least one passage defined by each of the first bearing pad 332, second bearing pad 334, and third bearing pad 336).

In some implementations, the at least one passage defined in each of the first bearing pad 332, the second bearing pad 334, and the third bearing pad 336 can include a first passage 360 and a second passage 362. The first passage 360 can extend along the first axis. In this manner, the gas exiting the first passage 360 can lift the rotor 310 off of the bearing pads (e.g., first bearing pad 332, second bearing pad 334, third bearing pad 336) such that the rotor 310 is spaced apart from the bearing pads along the first axis. The second passage 362 can extend along the second axis. In this manner, the second passage 362 can be configured to control a position of the rotor 310 along the second axis. More particularly, the gas exiting the second passage 362 can oppose forces acting on the rotor 310 such that movement of the rotor 310 along the second axis is constrained.

In some implementations, one or more of the bearing pads (e.g., first bearing pad 332, second bearing pad 334, third bearing pad 336) can define at least one additional passage that is separate from the one or more passages (e.g., first passage 360, second passage 362) configured to direct gas flowing therethrough onto the rotor 310 to control the position of the rotor along the first axis and the second axis. As shown, the second bearing pad 334 and the third bearing pad 336 can each define a third passage 364 that is separate from the first passage 360 and the second passage 362.

In some implementations, the third passage 364 defined by the second bearing pad 334 and the third bearing pad 336 can be fluidly coupled to separate conduits of the gas supply 320. For instance, the third passage 364 defined by the second bearing pad 334 can be fluidly coupled to a second conduit 370 of the gas supply 320. Conversely, the third passage 364 defined by the third bearing pad 336 can be fluidly coupled to a third conduit 380 of the gas supply 320.

The third passage 364 can be configured to direct gas flowing therethrough onto the rotor 310 to control rotation of the rotor 310 about the first axis. For instance, the third passage 364 defined by the second bearing pad 334 can be configured to direct gas flowing therethrough onto the rotor 310 to speed up (that is, accelerate) rotation of the rotor 310 about the first axis. Conversely, the third passage 364 defined by the third bearing pad 336 can be configured to direct gas flowing therethrough onto the rotor 310 to slow down (that is, decelerate) rotation of the rotor 310 about the first axis.

Figure 6:
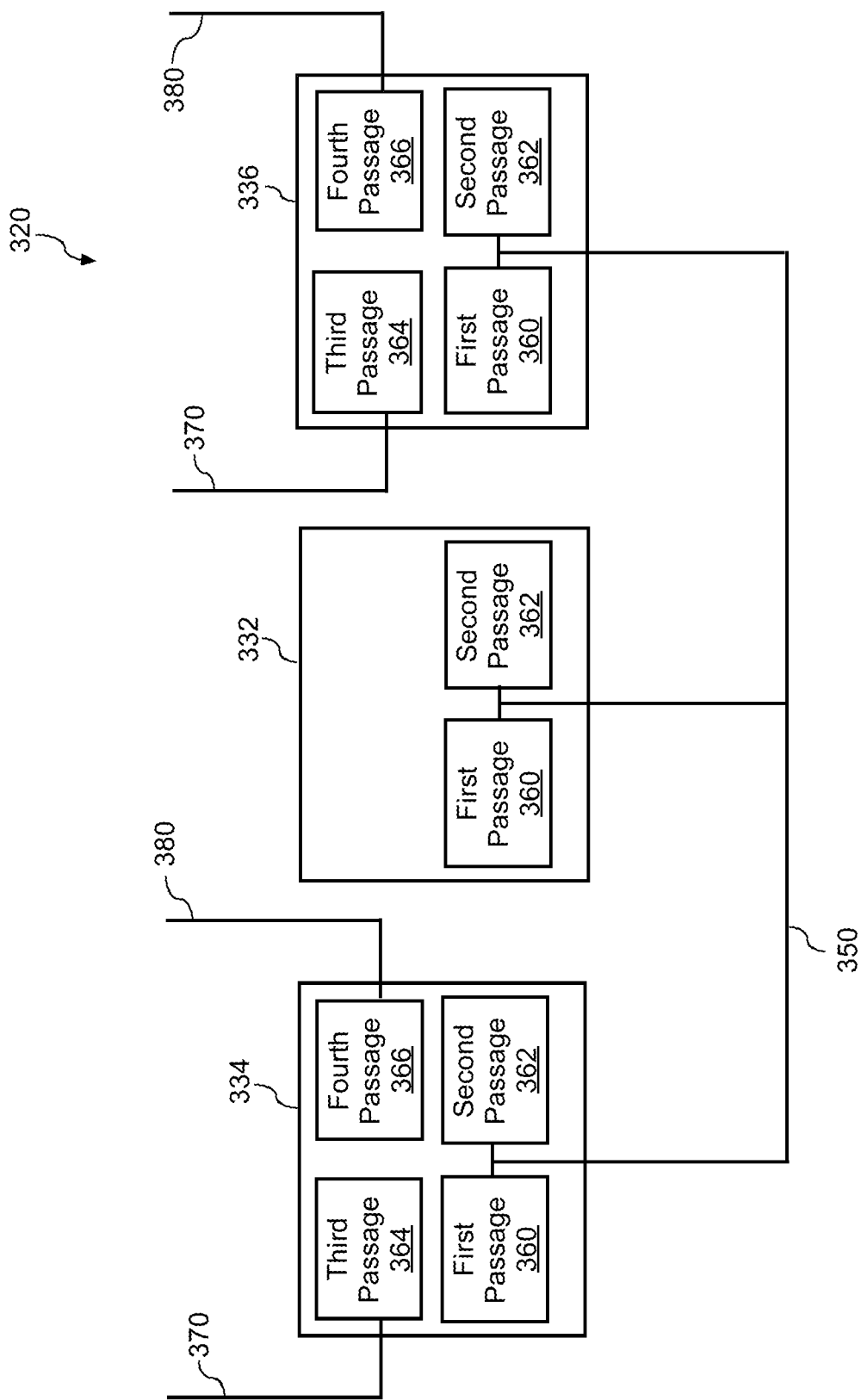
FIG. 6 depicts a gas supply of a workpiece support according to another example embodiment of the present disclosure.

Referring now to FIG. 6, another embodiment of the gas supply 320 is provided according to an example embodiment of the present disclosure. As shown, the second bearing pad 334 and the third bearing pad 336 can each define a fourth passage 366. Furthermore, the third passage 364 and the fourth passage 366 defined in the second bearing pad 334 and the third bearing pad 336 can be fluidly coupled to the second conduit 370 and the third conduit 380, respectively. In such implementations, the third passage 364 can be configured to direct gas flowing therethrough onto the rotor 310 to speed up (that is, accelerate) rotation of the gas about the first axis. Conversely, the fourth passage 366 can be configured to direct gas flowing therethrough onto the rotor 310 to slow down (that is, decelerate) rotation of the gas about the first axis.

Figure 7:
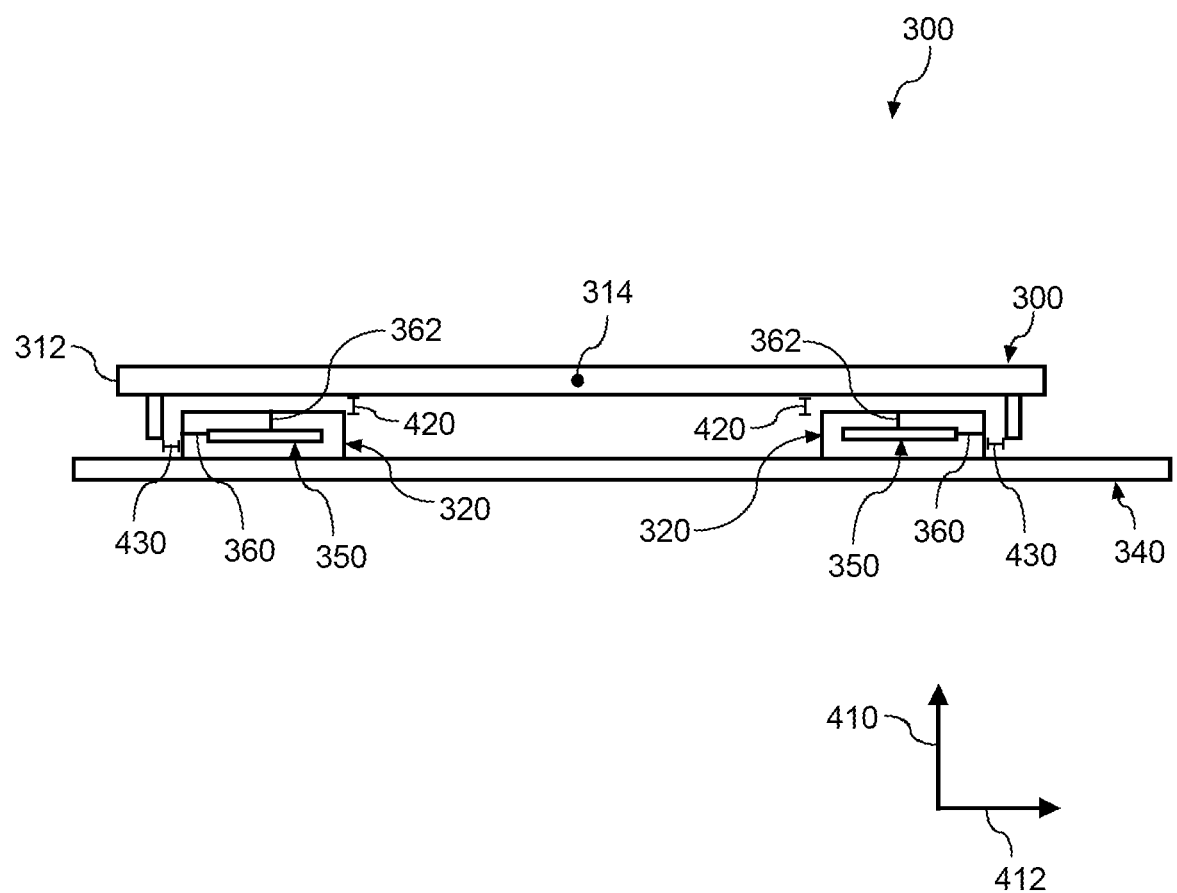
FIG. 7 depicts a cross-sectional view of a workpiece support assembly according to an example embodiment of the present disclosure.

Referring now to FIG. 7, a cross-sectional view of the workpiece support 300 is provided according to an example embodiment of the present disclosure. As shown, each of the plurality of bearing pads 330 can define the first passage 360 and the second passage 362. The first passage 360 can extend along a first axis 410. In this manner, the first passage 360 can direct gas flowing therethrough onto the rotor 310 to lift the rotor 310 off of the plurality of bearing pads 330. Conversely, the second passage 362 can extend along a second axis 412 that is substantially perpendicular to the first axis 410. In this manner, the second passage 362 can direct gas flowing therethrough onto the rotor 310 to oppose force acting on the rotor 310 and thereby constrain movement of the rotor 310 along the second axis 412.

As shown, a first air gap 430 can be defined between the rotor 310 and the plurality of bearing pads 330 along the first axis 410 when the first passage 360 directs gas flowing therethrough onto the rotor 310. Furthermore, a second air gap 440 can be defined between the rotor 310 and the plurality of bearing pads 330 along the second axis 412 when the second passage 362 directs gas flowing therethrough onto the rotor 310. In some implementations, the first air gap 430 and the second air gap 440 can each range from about 10 micrometers to about 50 micrometers.

Figure 8:
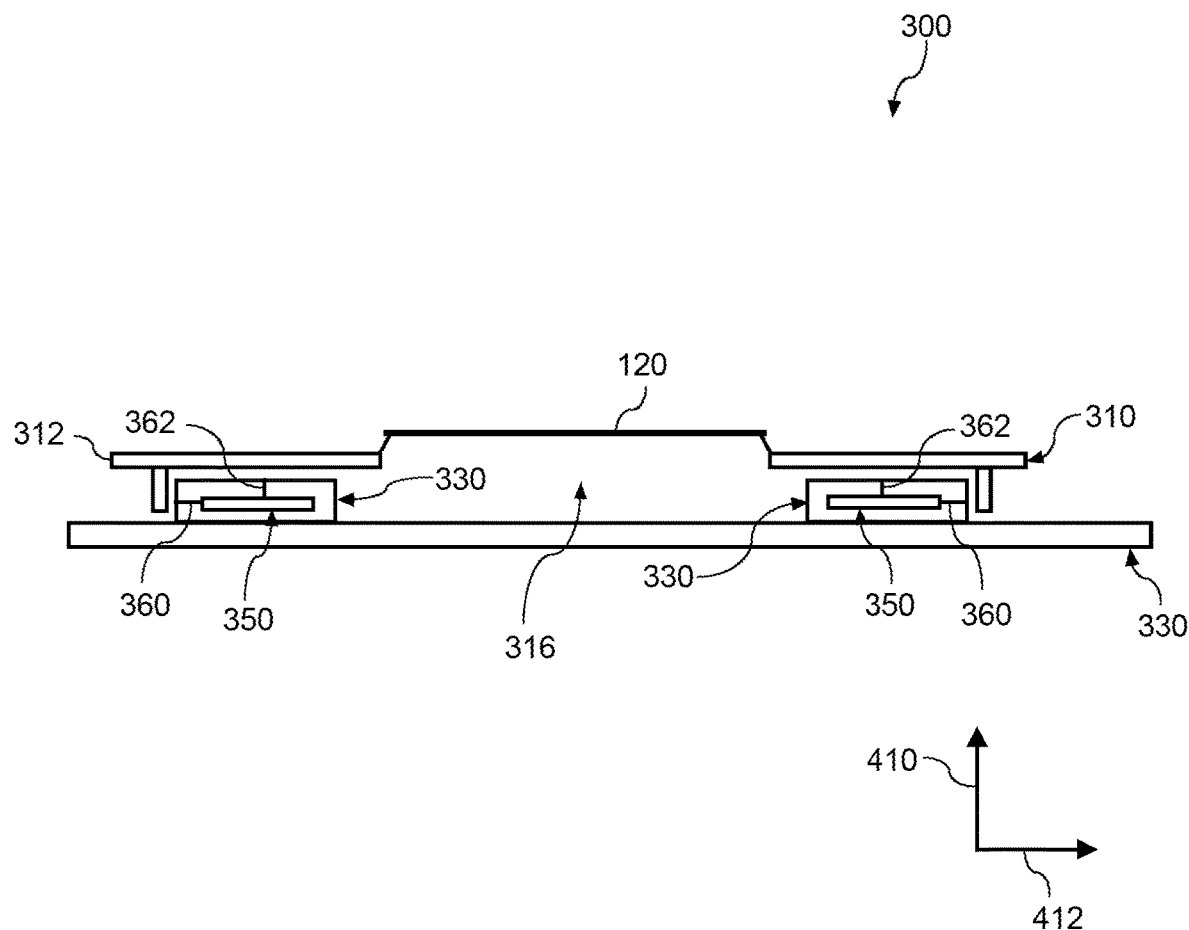
FIG. 8 depicts a cross-sectional view of a workpiece support assembly according to another example embodiment of the present disclosure.

Referring now to FIG. 8, a cross-sectional view of the workpiece support 300 is provided according to another example embodiment of the present disclosure. The workpiece support 300 can be configured in substantially the same manner as the workpiece support 300 in FIG. 7. For instance, each of the bearing pads 330 of the workpiece support 300 in FIG. 8 can define the first passage 360 extending along the first axis 410 and the second passage 362 extending along the second axis 412. However, in contrast to the workpiece support 300 in FIG. 7, the rotor 310 of the workpiece support 300 in FIG. 8 can define an aperture 316. Furthermore, the rotor 310 in FIG. 8 can be configured to support the workpiece 120 such that the workpiece 120 is positioned over the aperture 316. In this manner, the one or more heat sources 150 (FIG. 1) of the thermal processing system 100 can have an unobstructed view of the workpiece 120.

Figure 9:
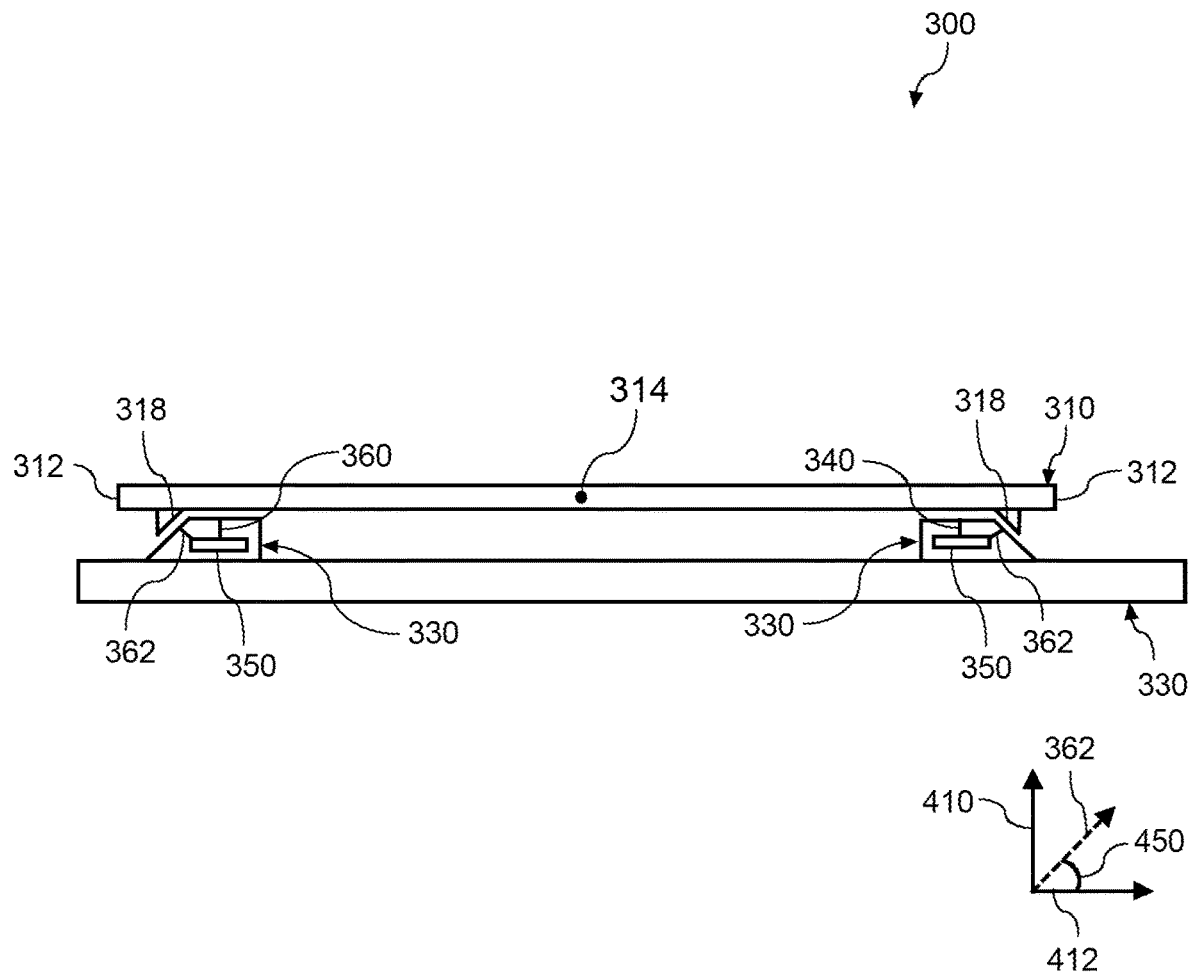
FIG. 9 depicts a cross-sectional view of a workpiece support assembly according to yet another example embodiment of the present disclosure.

Referring now to FIG. 9, a cross-sectional view of the workpiece support 300 is provided according to yet another example embodiment of the present disclosure. The workpiece support 300 can be configured in substantially the same manner as the workpiece support 300 in FIG. 7. For instance, each of the bearing pads 330 of the workpiece support 300 in FIG. 9 can include the first passage 360 extending along the first axis 410. Furthermore, each of the bearing pads 330 of the workpiece support 300 in FIG. 9 can define the second passage 362. However, in contrast to the second passage 362 defined by each of the bearing pads 330 in FIG. 7, the second passage 362 defined by each of the bearing pads 330 in FIG. 9 do not extend along the second axis 412. Instead, the second passage 362 defined by each of the bearing pads 330 is angled relative to the second axis 412 so that the second passage 362 directs gas flowing therethrough onto a tapered surface 318 of the rotor 310. For instance, in some implementations, the second passage can be angled relative to the second axis 412 such that an acute angle 450 (e.g., less than 90 degrees) is defined between the second passage 362 and the second axis 412.

Figure 10:
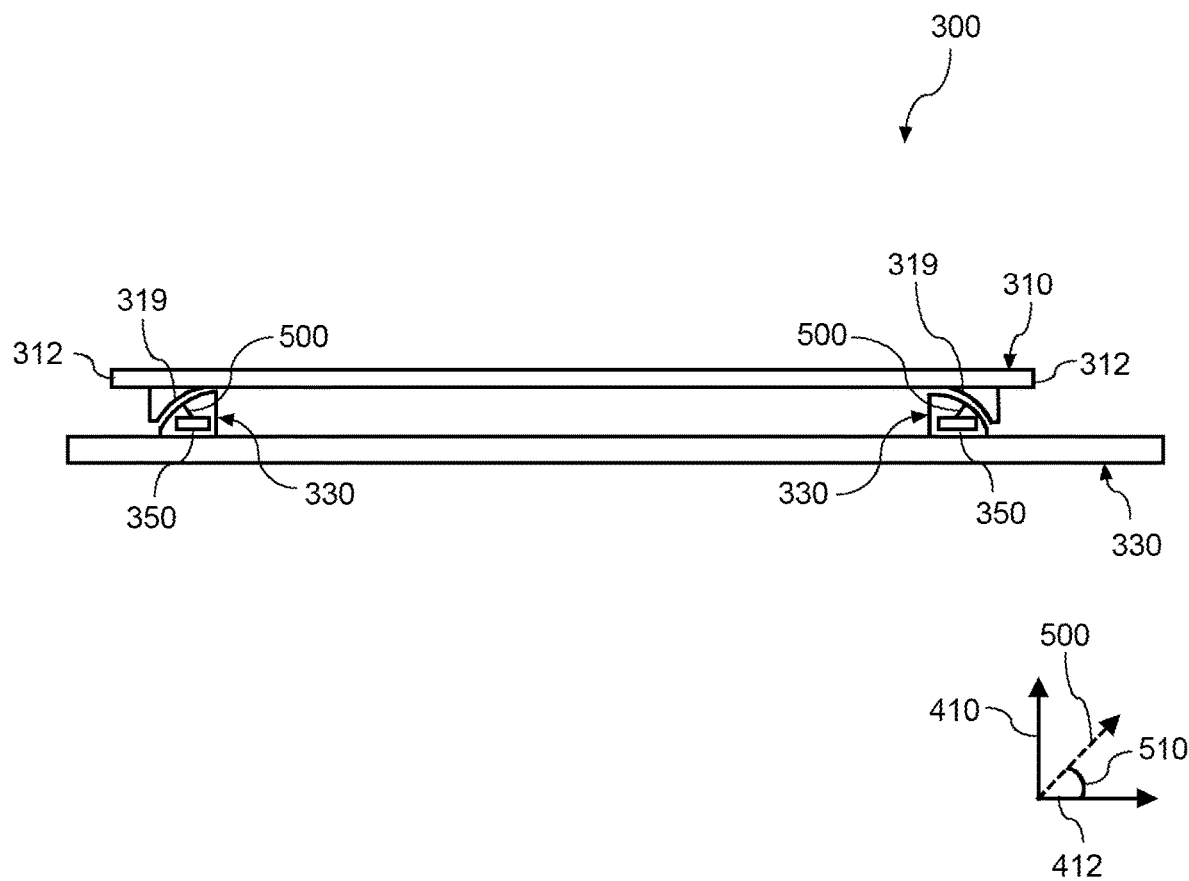
FIG. 10 depicts a cross-sectional view of a workpiece support assembly according to still another example embodiment of the present disclosure.

Referring now to FIG. 10, a cross-sectional view of the workpiece support 300 is provided according to still another example embodiment of the present disclosure. The workpiece support 300 can be configured in substantially the same manner as FIG. 7. For instance, the workpiece support 300 in FIG. 10 can include the plurality of bearing pads 330 positioned closer to the periphery 312 of the rotor 310 than to the center 314 of the rotor 310. However, in contrast to the bearing pads 330 in FIG. 7, the bearing pads 330 in FIG. 10 do not define two separate passages (e.g., first passage 360 and second passage 362 in FIG. 7) configured to direct gas flowing therethrough onto the rotor to control a position of the rotor 310 along the first axis 410 and the second axis 412. Instead, the bearing pads 330 in FIG. 10 include a single passage 500 fluidly coupled to the first conduit 350 of the gas supply 320 (FIG. 2). Furthermore, the single passage 500 can be angled relative to the second axis 412. For instance, in some implementations, an acute angle 510 (e.g., less than 90 degrees) can be defined between the single passage 500 and the second axis 400. The single passage 500 can be configured to direct gas flowing therethrough onto a curved surface 319 of the rotor 310. In this manner, a position of the rotor 310 along the first axis 410 and the second axis 412 can be controlled via emitting gas from one passage (e.g., single passage 500) as opposed to emitting gas from two separate passage (e.g., first passage 360 and second passage 362).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A workpiece support for a thermal processing system, the workpiece support comprising: a rotor configured to support a workpiece; a gas supply comprising a plurality of bearing pads, each of the bearing pads positioned closer to a periphery of the rotor than a center of the rotor, and a first passage extending along a first axis, the first passage configured to direct gas onto the rotor to control the position of the rotor along the first axis; a second passage extending along a second axis, the second passage configured to direct gas onto the rotor to control the position of the rotor along the second axis; a third passage configured to direct gas onto the rotor to accelerate rotation of the rotor about the first axis; and a fourth passage configured to direct gas onto the rotor to decelerate rotation of the rotor about the first axis.

2. The workpiece support of claim 1, wherein:
the first passage tapers along the first axis; and
the second passage tapers along the second axis.

3. The workpiece support of claim 1, wherein:
when gas is directed onto the rotor via the first passage to control the position of the rotor along the first axis, a first air gap is defined between the rotor and the plurality of bearing pads along the first axis; and
when gas is directed onto the rotor via the second passage to control the position of the rotor along the second axis, a second air gap is defined between the rotor and the plurality of bearing pads along the second axis.

4. The workpiece support of claim 3 wherein the first air gap and the second air gap range from about 10 micrometers to about 50 micrometers.

5. The workpiece support of claim 1, wherein the gas supply further comprises:
a first conduit fluidly coupled to the first passage and the second passage, the first conduit configured to deliver gas to the first passage and the second passage;
a second conduit fluidly coupled to the third passage, the second conduit configured to deliver the gas to the third passage; and a third conduit fluidly coupled to the fourth passage, the third conduit configured to deliver the gas to the fourth passage.

6. The workpiece support of claim 1, further comprising: a support configured to support the plurality of bearing pads.

7. The workpiece support of claim 1, wherein the rotor defines an aperture.

8. The workpiece support of claim 7, wherein the rotor is configured to support the workpiece such that the workpiece is positioned over the aperture.

9. The workpiece support of claim 7, wherein at least one of the first passage, second passage, third passage, and fourth passage defined in each of the plurality of bearing pads are angled relative to the second axis.

10. A thermal processing system comprising: a processing chamber; and a workpiece support disposed within the processing chamber, the workpiece support comprising: a rotor configured to support a workpiece; a gas supply comprising a plurality of bearing pads, each of the bearing pads positioned closer to a periphery of the rotor than a center of the rotor; a first passage extending along a first axis, the first passage configured to direct gas onto the rotor to control the position of the rotor along the first axis; a second passage extending along a second axis, the second passage configured to direct gas onto the rotor to control the position of the rotor along the second axis; a third passage configured to direct gas onto the rotor to accelerate rotation of the rotor about the first axis; and a fourth passage configured to direct gas onto the rotor to decelerate rotation of the rotor about the first axis.

11. The thermal processing system of claim 10, further comprising:
a support configured to support the plurality of bearing pads.

12. The thermal processing system of claim 10, wherein the rotor defines an aperture.

13. The thermal processing system of claim 12, wherein the rotor is configured to support the workpiece such that the workpiece is positioned over the aperture.

14. The thermal processing system of claim 10, wherein at least one of the first passage, second passage, third passage, and fourth passage defined in each of the plurality of bearing pads are angled relative to the second axis.

15. The thermal processing system of claim 14, wherein, at least one of the first passage, second passage, third passage, and fourth passage are configured to direct gas onto a curved surface of the rotor.

* * * * *